(12) United States Patent
Yagyu (10) Patent No.: US 10,680,360 B2
(45) Date of Patent: Jun. 9, 2020

(54) PRESS-FIT TERMINAL AND ELECTRONIC DEVICE INCLUDING PRESS-FIT TERMINAL (71) Applicant: DENSO CORPORATION, Kariya, Aichi-pref. (JP)

(72) Inventor: Yuki Yagyu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/369,047

(22) Filed: Mar. 29, 2019

(65) Prior Publication Data
US 2019/0312367 A1 Oct. 10, 2019

(30) Foreign Application Priority Data

Apr. 10, 2018 (JP) .................................. 2018-75530

(51) Int. Cl.
| | |
|---|---|
| *H01R 12/58* | (2011.01) |
| *H05K 1/18* | (2006.01) |
| *H05K 5/00* | (2006.01) |
| *H01R 4/62* | (2006.01) |

(52) U.S. Cl.
CPC ........... *H01R 12/585* (2013.01); *H05K 1/184* (2013.01); *H05K 5/0069* (2013.01); *H01R 4/62* (2013.01); *H05K 2201/1078* (2013.01); *H05K 2201/1081* (2013.01)

(58) Field of Classification Search
CPC ...... H01R 12/585; H01R 13/41; H01R 12/58; H01R 13/05; H05K 2201/1059; H05K 2201/09827; H05K 2201/10303; H05K 2201/10787
See application file for complete search history.

(56) References Cited

U.S. PATENT DOCUMENTS

| | | | | | |
|---|---|---|---|---|---|
| 4,655,537 | A | * | 4/1987 | Andrews, Jr. ........ | H01R 12/585 439/751 |
| 4,698,026 | A | * | 10/1987 | Rolf ...................... | H01R 12/58 439/751 |
| 5,073,119 | A | * | 12/1991 | Soes .................... | H01R 12/585 439/751 |
| 5,478,257 | A | * | 12/1995 | Cachina ............. | H01R 12/7064 439/567 |
| 5,989,064 | A | * | 11/1999 | Harlan ............... | H01R 12/7064 439/567 |
| 6,149,471 | A | * | 11/2000 | Kemp .................... | H01R 13/41 439/444 |

(Continued)

FOREIGN PATENT DOCUMENTS

JP 2015-222690 A 12/2015

*Primary Examiner* — Edwin A. Leon
*Assistant Examiner* — Matthew T Dzierzynski
(74) *Attorney, Agent, or Firm* — Posz Law Group, PLC (57) ABSTRACT

A press-fit terminal includes a bar part and a deformation part provided at an end portion of the bar part. The deformation part includes a recess, a front boundary portion and a rear boundary portion. The recess is provided between a front end portion of the deformation part and the end portion of the bar part. The front boundary portion defines a boundary between the recess and a surface of the deformation part adjacent to the front end portion of the deformation part. The rear boundary portion defines a boundary between the recess and the surface of the deformation part adjacent to the end portion of the bar part.

7 Claims, 4 Drawing Sheets

(56) References Cited

U.S. PATENT DOCUMENTS

| | | | | |
|---|---|---|---|---|
| 7,074,094 B2* | 7/2006 | Kawahara | ............ | H01R 12/585 |
| | | | | 439/733.1 |
| 7,377,823 B2* | 5/2008 | Chen | .................... | H01R 12/585 |
| | | | | 439/751 |
| 7,946,861 B2* | 5/2011 | Sander | ................. | H01R 12/585 |
| | | | | 439/82 |
| 8,771,028 B2* | 7/2014 | Tonosaki | ................ | H01R 13/03 |
| | | | | 439/151 |
| 8,992,235 B2* | 3/2015 | Kataoka | ............... | H01R 12/585 |
| | | | | 439/751 |
| 9,431,733 B1* | 8/2016 | Heistand | ................ | H01R 43/16 |
| 10,096,917 B1* | 10/2018 | Myer | ................. | H01R 12/585 |
| 10,159,157 B2* | 12/2018 | Su | ...................... | H05K 7/20854 |
| 10,230,184 B1* | 3/2019 | Myer | ................... | H01R 12/585 |
| 2013/0165001 A1 | 6/2013 | Kataoka | | |
| 2019/0140376 A1* | 5/2019 | Shirai | ................. | H01R 12/585 |

* cited by examiner

PRESS-FIT TERMINAL AND ELECTRONIC DEVICE INCLUDING PRESS-FIT TERMINAL

CROSS REFERENCE TO RELATED APPLICATION

The present application claims the benefit of priority from Japanese Patent Application No. 2018-75530 filed on Apr. 10, 2018. The entire disclosure of the above application is incorporated herein by reference.

TECHNICAL FIELD

The present disclosure relates to a press-fit terminal and an electronic device including the press-fit terminal.

BACKGROUND

A press-fit terminal has a press-fit portion including an opening portion and a pair of elastic contact portions disposed on both sides of the opening portion. For example, the press-fit terminal is inserted into a through hole of a circuit board while being elastically deformed in a direction in which the elastic contact portions come close to each other.

SUMMARY

The present disclosure provides a press-fit terminal including a bar part and a deformation part provided at an end portion of the bar part. The deformation part includes a recess, a front boundary portion and a rear boundary portion. The recess is provided between a front end portion of the deformation part and the end portion of the bar part. The front boundary portion defines a boundary between the recess and a surface of the deformation part adjacent to the front end portion of the deformation part. The rear boundary portion defines a boundary between the recess and the surface of the deformation part adjacent to the end portion of the bar part.

BRIEF DESCRIPTION OF THE DRAWINGS

The above and other objects, features and advantages of the present disclosure will become more apparent from the following detailed description made with reference to the accompanying drawings in which.

DETAILED DESCRIPTION

For example, a press-fit terminal may have saw-toothed grooves in an outer edge of each elastic contact portion. In this case, a front end portion of the press-fit terminal has an acute angle with respect to an inner peripheral surface of the through hole. The press-fit terminal may scrape the inner peripheral surface of the through hole while inserting the press-fit terminal into the through hole. Further, since plural saw-toothed grooves are provided in the press-fit terminal, the contact points of the press-fit terminal and the inner peripheral surface of the through hole may decrease. For this reason, the holding force of the press-fit terminal may decrease.

Hereinafter, multiple embodiments of the present disclosure will be described with reference to the drawings. In each embodiment, portions corresponding to those described in the preceding embodiment are denoted by the same reference numerals, and redundant descriptions will be omitted in some cases. In each embodiment, in a case where only a part of the configuration is described, the other part of the configuration may be applied with reference to the other embodiment described above.

First Embodiment

A press-fit terminal 100 of the present embodiment will be described with reference to FIGS. 1, 2, 3, and 4. In the present embodiment, an electronic device having the press-fit terminal 100 will be described as an example. However, the present disclosure is not limited to the example, and the press-fit terminal 100 may be applied to devices other than the electronic device.

Figure 1:
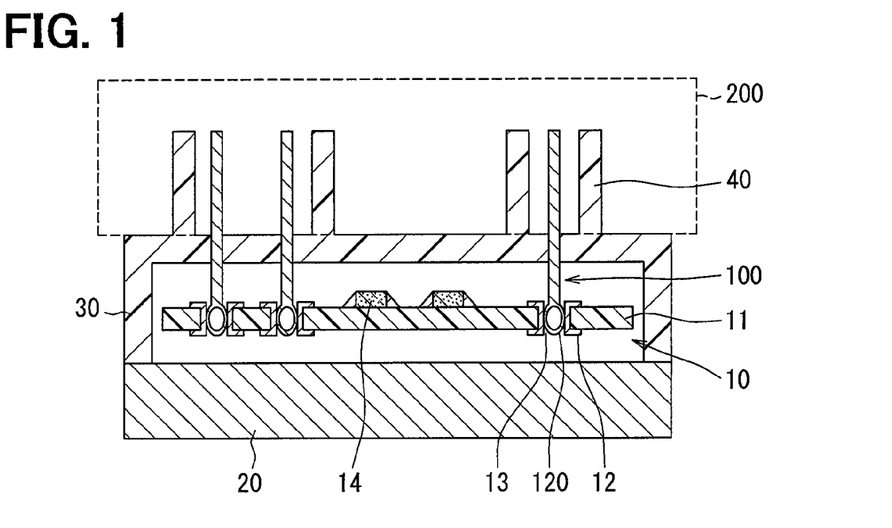
FIG. 1 is a cross-sectional view showing a schematic configuration of an electronic device according to a first embodiment.

As shown in FIG. 1, the electronic device includes a circuit board 10, the press-fit terminals 100, and the like. The electronic device can be attached to an attachment object 200. For example, the electronic device is attached to the attachment object 200 by a screw or a fixing mechanism other than the screw.

The attachment object 200 is electrically connected to the electronic device via the press-fit terminals 100 of the electronic device. For example, a motor or the like can be adopted to the attachment object 200. Therefore, the electronic device can be applied to an electronic control unit that controls the attachment object 200. In this case, the attachment object 200 can also be referred to as a control object. In FIG. 1, the illustration of the attachment object 200 is simplified.

In the present embodiment, as an example, the electronic device includes a cover 20 and a base 30 proving an accommodation space for accommodating the circuit board 10. Further, in the present embodiment, the press-fit terminals 100 penetrate the base 30 and are integrated to the base 30. A connector case 40 is provided with the base 30 to surround a part of the press-fit terminals 100 protruding from the accommodation space. That is, a connector of the electronic device is provided by the connector case 40 and the part of the press-fit terminals 100 protruding from the accommodation space. The cover 20 and the base 30 correspond to a housing providing the accommodation space when being assembled.

Figure 2:
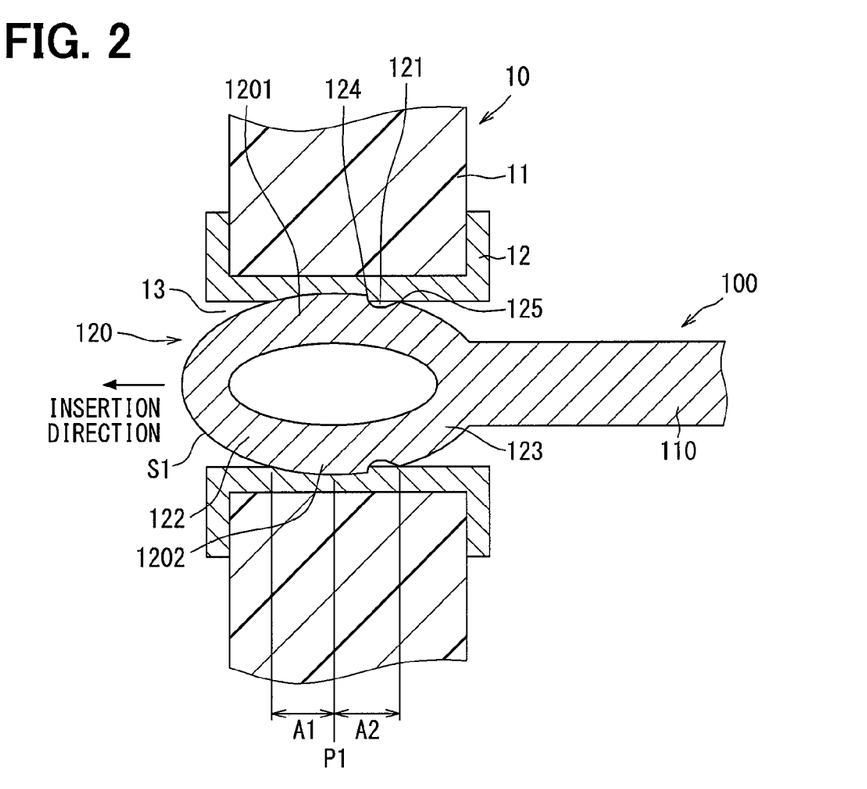
FIG. 2 is a cross-sectional view showing a schematic configuration of a press-fit terminal in an inserted state according to the first embodiment.

As shown in FIGS. 1 and 2, the circuit board 10 includes a resin base material 11 on which wirings of conductive members are formed, and circuit elements 14 mounted on the resin base material 11 and electrically connected to the wirings. The resin base material 11 has through holes 13 penetrating the resin base material 11 in a thickness direction of the resin base material 11 and surrounded by through hole plating 12. In other words, in the resin base material 11, an annular through hole plating 12 is formed on a surface of a side wall around a periphery of the through hole 13. The through hole 13 is surrounded by the through hole plating 12. The through hole plating 12 mainly contains a metal such as copper or tin. In other words, the through hole plating 12 contains copper or tin as a main constituent. The circuit board 10 corresponds to an attachment body. The through hole plating 12 corresponds to a surface conductor. The through hole 13 corresponds to an insertion hole.

Figures 3, 4:
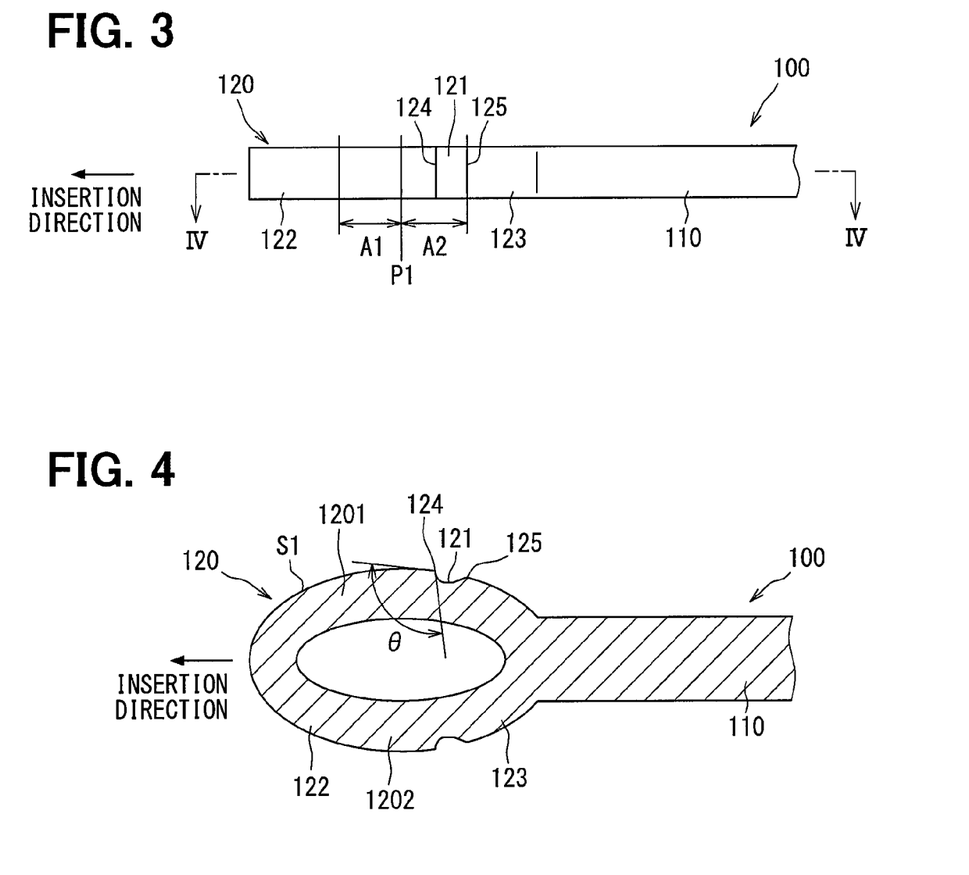
FIG. 3 is a side view showing a schematic configuration of the press-fit terminal according to the first embodiment.
FIG. 4 is a cross-sectional view taken along a line IV-IV of FIG. 3.

The press-fit terminal 100 is inserted into the through hole 13 of the circuit board 10 and is deformed in the through hole 13. The press-fit terminal 100 is electrically connected to the through hole plating 12 of the through hole 13 by a reaction force caused by deformation. As shown in FIG. 2, FIG. 3 and FIG. 4, the press-fit terminal 100 includes a bar part 110 and a deformation part 120 provided at an end portion of the bar part 110. The bar part 110 and the deformation part 120 are integrated to provide the press-fit terminal 100.

The press-fit terminal 100 is mainly made of metal. The surface of the press-fit terminal 100 may be plated. In the present embodiment, the press-fit terminal 100 having a needle eye shape is used. However, the present disclosure is not limited to the embodiment, the press-fit terminal 100 having a different shape from the needle eye shape may be used.

As described above, the bar part 110 has the deformation part 120 formed at one end portion, and the other end portion of the bar part 110 is surrounded by the connector case 40. The other end portion of the bar part 110 provides a part of the connector. The other end portion of the bar part 110 is in direct and mechanical contact with the attachment object 200. In the present embodiment, the bar part 110 has a linear shape. However, the present disclosure is not limited to the embodiment, the bar part 110 may have a bent shape.

The deformation part 120 is inserted into the through hole 13. The deformation part 120 is deformed when being inserted into the through hole 13. More specifically, since the deformation part 120 is larger than the through hole 13, the deformation part 120 is press-fitted into the through hole 13. Therefore, when inserted into the through hole 13, the deformation part 120 is deformed by being in contact with the through hole plating 12, and applies the reaction force to the through hole plating 12. For example, the deformation part 120 deforms elastically and plastically. Accordingly, the insertion in the present disclosure can be paraphrased as press fitting.

As shown in FIG. 2, FIG. 3 and FIG. 4, the deformation part 120 has a shape expanding at a part between the front end portion of the deformation part 120 and the end portion of the bar part 110. In other words, the deformation part 120 has a shape expanding at a part between the front end portion and a portion of the deformation part 120 connected to the bar part 110. The end portion of the deformation part 120 connected to the bar part 110 may be referred to as a rear end portion.

More specifically, the deformation part 120 has an annular shape with a through hole orthogonal to the insertion direction. As shown in FIGS. 2 and 4, the deformation part 120 includes a first deformation part 1201 on one side of the through hole and a second deformation part 1202 on the other side. The first deformation part 1201 and the second deformation part 1202 are integrally provided to form the annular shape. That is, the deformation part 120 is divided into the first deformation part 1201 and the second deformation part 1202. When the press-fit terminal 100 is inserted into the through hole 13, the deformation part 120 is deformed in a direction in which the first deformation part 1201 and the second deformation part 1202 come close to each other. The deformation part 120 is deformed in a deformation direction orthogonal to the insertion direction and the penetration direction of the through hole.

Further, as shown in FIGS. 2 and 4, the deformation part 120 has a curved surface S1. For example, the deformation part 120 has a curved surface so that the width of the deformation part 120 gradually increases from the front end portion toward an apex P1 of the expanding shape. Further, the deformation part 120 has a curved surface so that the width of the deformation part 120 gradually decreases from a rear boundary portion 125, which will be described later, to the rear end portion of the deformation part 120.

The apex P1 is a portion where the width of the press-fit terminal 100 (i.e., width of the deformation part 120) is the maximum in a terminal widening direction in which the width of the press-fit terminal 100 expands. The apex P1 corresponds to the maximum width portion in the deformation direction in the contact regions A1 and A2. Further, for example, a smooth surface may be adopted as the surface S1 of the deformation part 120. However, the present disclosure is not limited to the example. The surface S1 may have asperities.

As shown in FIG. 2, the contact regions A1, and A2 are contact regions of the deformation part 120 in contact with the through hole plating 12 in a state where the press-fit terminal 100 is inserted in the through hole 13. The front contact region A1 is a region between the apex P1 and the front end portion in the contact region of the deformation part 120 and the through hole plating 12. The rear contact region A2 is a region between the apex P1 and the rear end portion in the contact region of the deformation part 120 and the through hole plating 12. In the present embodiment, a recess 121 is formed in the rear contact region A2. Therefore, the rear contact region A2 is not in contact with the through hole plating 12 only in a region where the recess 121 is formed.

The deformation part 120 includes the recess 121 recessed in the deformation direction from the peripheral portion. The recess 121 is provided between the front end portion and the rear end portion of the deformation part 120. The recess 121 is provided in each of the first deformation part 1201 and the second deformation part 1202. One of the recesses 121 extends from end to end in the penetration direction of the first deformation part 1201. The other one of the recesses 121 extends from end to end in the penetration direction of the second deformation part 1202.

Further, the recess 121 has a curved surface. That is, the recess 121 does not have a corner. Further in other words, an opening area of the recess 121 gradually increases from a bottom to an opening end of the recess 121. Therefore, even in a state where the deformation part 120 is inserted into the through hole 13, that is, even in a state where the deformation part 120 is deformed, stress is not likely to concentrate to the recess 121 and cracks may be suppressed in the press-fit terminal 100.

Furthermore, in the present embodiment, the recesses 121 are provided one by one for each of the first deformation part 1201 and the second deformation part 1202. As a result, the contact area of the press-fit terminal 100 with the through hole plating 12 can be increased as compared with the structure where the plurality of recesses 121 are provided in each of the first deformation part 1201 and the second deformation part 1202. That is, the holding force can be increased.

The recess 121 can be formed by press working of the deformation part 120. Therefore, the recess 121 can be easily provided.

In the present embodiment, the recess 121 is located between the apex P1 and the rear end portion of the deformation part 120. A part of the deformation part 120 between the recess 121 and the front end portion may be referred to as a front portion 122. A part of the deformation part 120 between the recess 121 and the rear end portion may be referred to as a rear portion 123.

The deformation part 120 includes a front boundary portion 124 defining a boundary between the recess 121 and a surface S1 of the deformation part 120 adjacent to the front end portion of the deformation part 120. The front boundary portion 124 has an obtuse angle with respect to the surface S1 of the deformation part 120. The deformation part 120 includes a rear boundary portion 125 defining a boundary between the recess 121 and the surface S1 of the deformation part 120 adjacent to the rear end portion of the deformation part 120. The rear boundary portion 125 has a curved surface shape.

As shown in FIG. 3, the front boundary portion 124 is formed by the intersection of the recess 121 and the surface S1 of the front portion 122. The front boundary portion 124 is a linear portion. In the present embodiment, as an example, the front boundary portion 124 has a liner shape extending from end to end of the deformation part 120 in the penetration direction. However, the front boundary portion 124 does not have to reach the end in the penetration direction.

As shown in FIG. 4, the surface S1 in the front portion 122 and the recess 121 intersect so that the surface S1 forms an angle θ with respect to a surface normal to the front boundary portion 124. This angle θ is a right angle or an obtuse angle. In other words, the front boundary portion 124 is a linear portion intersecting with the insertion direction and the deformation direction. In the present embodiment, as an example, the front boundary portion 124 is linear and the angle θ is an obtuse angle. In other words, the boundary between the recess 121 and the surface S1 of the deformation part 120 adjacent to the front end portion of the deformation part 120 is not curved and has a corner.

Furthermore, as shown in FIG. 3, in the present embodiment, the front boundary portion 124 extends in a direction different from the insertion direction. More specifically, the front boundary portion 124 extends in a direction orthogonal to the insertion direction, that is, along the penetration direction.

As a result, when a force is applied to the press-fit terminal 100 in a direction opposite to the insertion direction in a state where the press-fit terminal 100 is inserted in the through hole 13, the front boundary portion 124 exerts a resistance force. Therefore, the press-fit terminal 100 is less likely to be dropped out of the insertion hole.

The front boundary portion 124 may be rephrased as a ridgeline connecting the surface S1 of the front portion 122 and a recessed surface which is the surface of the recess 121. The front boundary portion 124 may be also rephrased as a boundary line between the recess 121 and the surface S1 of the front portion 122. The ridgeline exists in a plane in contact with the through hole plating 12 in the press-fit terminal 100. In the press-fit terminal 100, the angle θ, which is formed on the surface having the ridgeline as the normal line by the recessed surface and the surface S1 in the front portion 122, is a right angle or an obtuse angle.

The front boundary portion 124 is provided in the contact regions A1 and A2 between the deformation part 120 and the through hole plating 12.

Especially in the present embodiment, as shown in FIGS. 2 and 3, the front boundary portion 124 is provided between the apex P1 and the rear end portion in the contact regions A1 and A2 of the deformation part 120 and the surface conductor. That is, the front boundary portion 124 is provided in the rear contact region A2. In other words, the front boundary portion 124 is provided at a position between the apex P1 and the rear end portion, and the position is lower than the apex P1. In addition, the front boundary portion 124 is provided in a portion that comes into contact with the through hole plating 12 after the apex P1 when inserting the press-fit terminal 100 into the through hole 13.

As a result, the through hole plating 12 is less likely to be scraped by the press-fit terminal 100 when inserting the press-fit terminal 100 into the through hole 13. Therefore, reduction of the holding force caused by the press-fit terminal 100 scraping the through hole plating 12 can be suppressed. Further, since the scraping of the through hole plating 12 by the press-fit terminal 100 can be suppressed, electrical connection state between the press-fit terminal 100 and the through hole plating 12 can be secured.

Since the angle formed by the front boundary portion 124 is not an acute angle, the stress on the through hole plating 12 is weak during the insertion of the deformation part 120 into the through hole 13 or just after insertion. Therefore, the front boundary portion 124 is less likely to break into the through hole plating 12. In other words, the front boundary portion 124 does not break into the through hole plating 12 and is not locked during the insertion of the deformation part 120 into the through hole 13 or just after insertion. In addition, since the angle formed by the front boundary portion 124 is not an acute angle, the holding force of the deformation part 120 in the through hole 13 can be obtained without applying damages such as abrasion to the through hole plating 12.

The front boundary portion 124 applies a weak stress to the through hole plating 12 when the deformation part 120 is inserted into the through hole 13. When the deformation part 120 is inserted into the through hole 13, the front boundary portion 124 continues to apply a stress to a stress concentration portion and the vicinity thereof. The stress concentration portion is a part of the through hole plating 12 that is in contact with the front boundary portion 124. Therefore, the front boundary portion 124 can cause creep deformation of the resin base material 11 and the through hole plating 12. In other words, the creep deformation of the resin base material 11 and the through hole plating 12 is caused by the stress (e.g., contact load) applied from the front boundary portion 124 after a lapse of time since the deformation part 120 is inserted into the through hole 13.

More specifically, when the stress is applied from the deformation part 120 to the resin base material 11 and the through hole plating 12, the resin base material 11 and the through hole plating 12 volumetrically move from a place where the applied stress is large to a place where the applied stress is small. Further, the resin base material 11 and the through hole plating 12 are applied with the largest stress at the portion in contact with the front boundary portion 124. The stress is smaller at a periphery of the portion in contact with the front boundary portion 124. The stress is smallest at a portion where the resin base material 11 and the through hole plating 12 are not in contact with the deformation part 120, such as a portion facing the recess 121. Therefore, the resin base material 11 and the through hole plating 12 volumetrically move from the portion in contact with the front boundary portion 124 to the periphery thereof and the recess 121. Incidentally, the creep deformation of the resin base material 11 and the through hole plating 12 is accelerated as the ambient temperature is higher.

As described above, since the deformation part 120 includes the recess 121, the deformation part 120 can deform the resin base material 11 and the through hole plating 12 so that a part of the through hole plating 12 enters into the recess 121. As a result, the front boundary portion 124 gradually breaks into the through hole plating 12 and has the lock function as time elapses after the deformation part 120 is inserted into the through hole 13. Further, the press-fit terminal 100 adds the resistance force against the deformation of the through hole plating 12, into which the front boundary portion 124 and the like breaks, to the holding force in addition to the contact load resisting against the external force moving the press-fit terminal 100.

As shown in FIGS. 2 and 4, differently from the front boundary portion 124, the rear boundary portion 125 is not a linear portion but has a curved surface shape. That is, the rear boundary portion 125 has a curved surface in the cross-sectional view of FIG. 4. The rear boundary portion 125 may be expressed as a portion smoothly connecting the recess 121 and the surface S1. In other words, a corner of the recess 121 adjacent to the rear end portion is rounded by the rear boundary portion 125. In the present embodiment, as an example, the rear boundary portion 125 extends from end to end of the deformation part 120 in the penetration direction.

In the present embodiment, the rear boundary portion 125 is located lower than the front boundary portion 124. In other words, the interval between the two rear boundary portions 125 is shorter than the interval between the two apexes P1 and the interval between the two front boundary portions 124. The interval between the rear boundary portions 125 corresponds to the interval between vertexes of the rear boundary portions 125.

As described above, the deformation part 120 of the press-fit terminal 100 includes the front boundary portion 124 having an obtuse angle with respect to the surface S1 of the deformation part 120. When the deformation part 120 is inserted into the through hole 13, stress is applied to the through hole plating 12 to deform the through hole plating 12. In particular, the recess 121 is provided in the press-fit terminal 100. The through hole plating 12 can be easily deformed by the stress applied from the front boundary portion 124. Therefore, in the press-fit terminal 100, at least the front boundary portion 124 of the deformation part 120 breaks into the through hole plating 12 to increase the holding force as compared with the structure without the front boundary portion 124. In addition, since the holding force can be increased in this way, the press-fit terminal 100 is less likely to be dropped out of the through hole 13.

Furthermore, the rear boundary portion 125 has the curved surface shape. The scraping of the through hole plating 12 by the press-fit terminal 100 can be suppressed when inserting the press-fit terminal 100 into the through hole 13. Therefore, reduction of the holding force caused by the press-fit terminal 100 scraping the through hole plating 12 can be suppressed. Further, since the scraping of the through hole plating 12 by the press-fit terminal 100 can be suppressed, electrical connection state between the press-fit terminal 100 and the through hole plating 12 can be secured. Even if the front boundary portion 124 has a right angle with respect to the surface S1 of the deformation part 120 in the press-fit terminal 100, similar effects can be obtained.

The electronic device includes the press-fit terminal 100 capable of exhibiting the above-mentioned effects. Therefore, in the electronic device, the press-fit terminal 100 is less likely to be easily dropped out of the circuit board 10. Further, mechanical and electrical connection between the circuit board 10 and the press-fit terminal 100 can be improved in the electronic device.

The preferred embodiment of the present disclosure has been described herein. However, the present disclosure is not limited to the above embodiment. Various modifications may be made without departing from the scope and spirit of the present disclosure. Hereinafter, second to fifth embodiments will be described as other embodiments of the present disclosure. Each of the above embodiment and the second to fifth embodiments may be independently implemented, or may be combined appropriately. The present disclosure is not limited to combinations disclosed in the above-described embodiment but may be implemented in various combinations.

Second Embodiment

Figure 5:
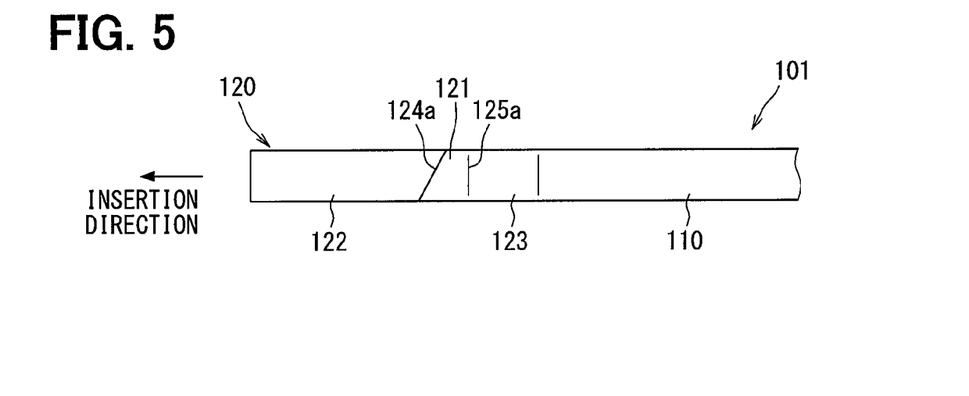
FIG. 5 is a side view showing a schematic configuration of a press-fit terminal according to a second embodiment.

A press-fit terminal 101 of a second embodiment will be described with reference to FIG. 5. FIG. 5 corresponds to the side view of FIG. 3. In the present embodiment, although the shape of the recess 121 is different from that in the above embodiment, the same reference numeral is used for convenience. The reference numeral for the recess 121 is similarly used in the following embodiments.

The press-fit terminal 101 includes a front boundary portion 124a and a rear boundary portion 125a. Similarly to the front boundary portion 124, the front boundary portion 124a defines a boundary between the recess 121 and the surface S1 of the deformation part 120 adjacent to the front end portion of the deformation part 120. The front boundary portion 124a has a right angle or an obtuse angle with respect to the surface S1 of the deformation part 120. However, differently from the front boundary portion 124, the front boundary portion 124a inclines with respect to the penetration direction. That is, the front boundary portion 124a is a linear portion extending obliquely in the side view of FIG. 5. The rear boundary portion 125a is similar to the rear boundary portion 125.

The press-fit terminal 101 can achieve similar effects to the press-fit terminal 100. Further, similarly to the above described embodiment, the press-fit terminal 101 may be applied to an electronic device. Therefore, the electronic device of the present embodiment can achieve similar effects as the above embodiment.

Third Embodiment

Figure 6:
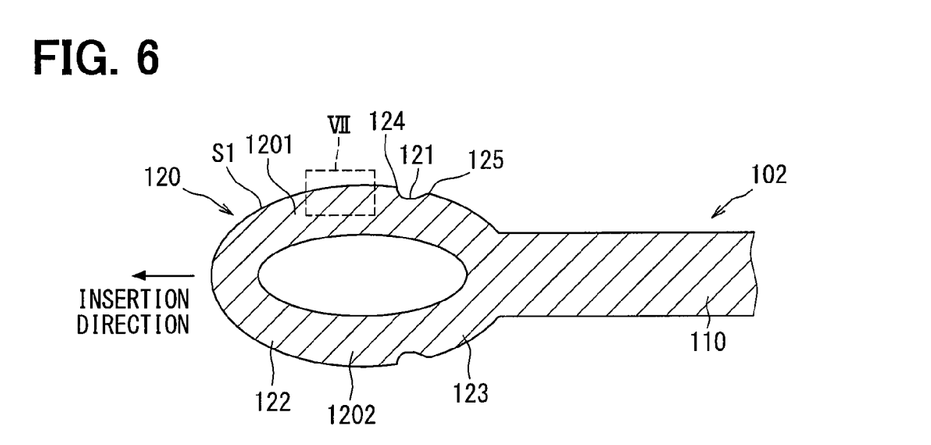
FIG. 6 is a cross-sectional view showing a schematic configuration of a press-fit terminal according to a third embodiment.

A press-fit terminal 102 of a third embodiment will be described with reference to FIGS. 6 and 7. FIG. 6 corresponds to the side view of FIG. 4.

Figure 7:
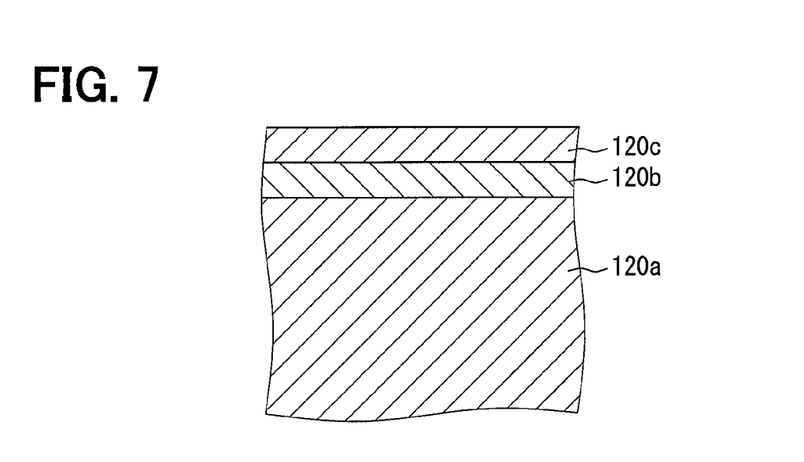
FIG. 7 is an enlarged cross-sectional view of a portion surrounded by a line VII of FIG. 6.

As shown in FIG. 7, the press-fit terminal 102 includes a base material 120a, a base plating 120b, and a surface plating 120c. In the press-fit terminal 102, the base plating 120b is formed on the surface of the base material 120a, and the surface plating 120c is formed on the surface of the base plating 120b.

For example, copper alloy such as phosphor bronze or the like may be used as a constituent material of the base material 120a. For example, nickel may be used as a constituent material of the base plating 120b. The base plating 120b is provided between the base material 120a and the surface plating 120c. As described above, in the present disclosure, the base plating 120b may be provided between the base material 120a and the surface plating 120c. However, in the present disclosure, the base plating 120b may not be provided and the surface plating 120c may be provided directly on the surface of the base material 120a. The base plating 120b may include two or more layers.

The surface plating 120c is provided on the surface of the base plating 120b. The surface plating 120c contains tin alloy. The tin alloy includes, for example, an alloy of copper and tin, an alloy of nickel and tin, and the like. The surface plating 120c is formed by, for example, a reflow treatment after plating treatment. As described above, at least the surface S1 of the deformation part 120 of the press-fit terminal 102 is plated with the tin alloy.

In the press-fit terminal, the surface of the deformation part may be plated with pure tin. In this case, comparatively soft tin is deformed by the contact load to be compatible with the through hole plating, and electrical characteristics are improved. However, the pure tin is relatively soft in the press-fit terminal in which the surface of the deformation part is plated with pure tin. When the press-fit terminal is press-fitted into the through hole, the press-fit terminal slides against the opening portion of the through hole to generate wear waste of pure Tin. The ware waste may be scattered in the neighboring electric circuits and cause short circuit in the circuit. On the other hand, since the surface plating 120c of the deformation part 120 contains tin alloy, the generation of wear waste due to pure tin wear can be suppressed in the press-fit terminal 102 as compared with the structure containing pure tin.

The press-fit terminal 102 can achieve similar effects to the press-fit terminal 100. Further, similarly to the above described embodiments, the press-fit terminal 102 may be applied to an electronic device. Therefore, the electronic device of the present embodiment can achieve similar effects as the above embodiments.

Fourth Embodiment

Figure 8:
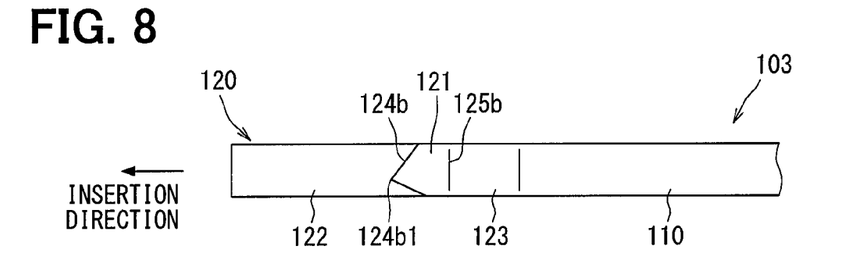
FIG. 8 is a side view showing a schematic configuration of a press-fit terminal according to a fourth embodiment.

A press-fit terminal 103 of a fourth embodiment will be described with reference to FIG. 8. FIG. 8 corresponds to the side view of FIG. 3.

The press-fit terminal 103 includes a front boundary portion 124b and a rear boundary portion 125b. Similarly to the front boundary portion 124, the front boundary portion 124b defines a boundary between the recess 121 and the surface S1 of the deformation part 120 adjacent to the front end portion of the deformation part 120. The front boundary portion 124b has a right angle or an obtuse angle with respect to the surface S1 of the deformation part 120. However, differently from the front boundary portion 124, the front boundary portion 124b includes a bent portion 124b1 protruding toward the front end portion. That is, in the front boundary portion 124b, a linear portion obliquely extending from one end in the penetration direction of the deformation part 120 and a linear portion obliquely extending from the other end are connected at the bent portion 124b1. The rear boundary portion 125b is similar to the rear boundary portion 125.

As a result, when a force is applied to the press-fit terminal 103 in a direction opposite to the insertion direction in a state where the press-fit terminal 103 is inserted in the through hole 13, the front boundary portion 124b exerts a resistance force greater than the front boundary portion 124. Therefore, the press-fit terminal 103 is further less likely to be dropped out of the through hole 13.

The press-fit terminal 103 can achieve similar effects to the press-fit terminal 100. Further, similarly to the above described embodiments, the press-fit terminal 103 may be applied to an electronic device. Therefore, the electronic device of the present embodiment can achieve similar effects as the above embodiments.

Fifth Embodiment

Figure 9:
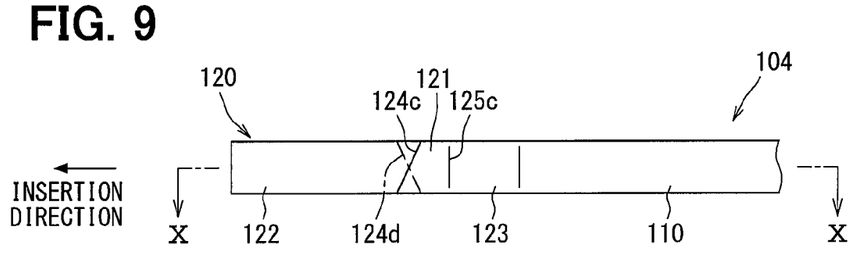
FIG. 9 is a side view showing a schematic configuration of a press-fit terminal according to a fifth embodiment.
Figure 10:
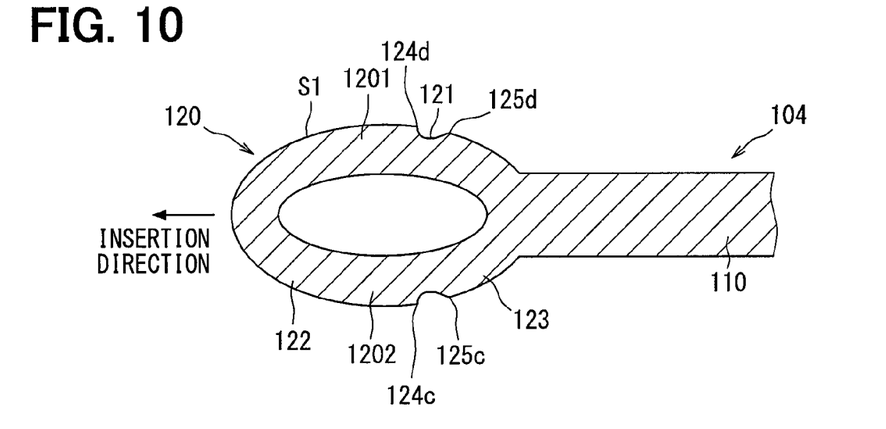
FIG. 10 is a cross-sectional view taken along a line X-X of FIG. 9.

A press-fit terminal 104 of a fifth embodiment will be described with reference to FIGS. 9 and 10. FIG. 9 corresponds to the side view of FIG. 3.

The press-fit terminal 104 includes a first front boundary portion 124c, a second front boundary portion 124d, a first rear boundary portion 125c and a second rear boundary portion 125d. The first deformation part 1201 includes the first front boundary portion 124c, which is the front boundary portion, and the first rear boundary portion 125c. The second deformation part 1202 includes the second front boundary portion 124d, which is the front boundary portion, and the second rear boundary portion 125d. The first rear boundary portion 125c and the second rear boundary portion 125d are similar to the rear boundary portion 125.

Similarly to the front boundary portion 124, each of the first front boundary portion 124c and the second front boundary portion 124d defines a boundary between the recess 121 and the surface S1 of the deformation part 120 adjacent to the front end portion of the deformation part 120. Each of the first front boundary portion 124c and the second front boundary portion 124d has a right angle or an obtuse angle with respect to the surface S1 of the deformation part 120. In addition, similarly to the front boundary portion 124a, each of the first front boundary portion 124c and the second front boundary portion 124d inclines with respect to the penetration direction. That is, each of the first front boundary portion 124c and the second front boundary portion 124d is a linear portion extending obliquely in the side view of FIG. 9. Further, the first front boundary portion 124c and the second front boundary portion 124d extend in directions different from the insertion direction. The first front boundary portion 124c and the second front boundary portion 124d incline with respect to the insertion direction in directions different from each other.

As a result, when a force is applied to the press-fit terminal 104 in a direction opposite to the insertion direction in a state where the press-fit terminal 104 is inserted in the through hole 13, the front boundary portion exerts greater resistance force as compared with the structure in which the first front boundary portion 124c and the second front boundary portion 124d incline in the same direction. Therefore, the press-fit terminal 104 is further less likely to be dropped out of the through hole 13.

The press-fit terminal 104 can achieve similar effects to the press-fit terminal 100. Further, similarly to the above described embodiments, the press-fit terminal 104 may be applied to an electronic device. Therefore, the electronic device of the present embodiment can achieve similar effects as the above embodiments.

Optional aspects of the present disclosure will be set forth in the following clauses.

According to a first aspect of the present disclosure, a press-fit terminal includes a bar part and a deformation part. The press-fit terminal is for being press-fitted and deformed in an insertion hole of an attachment body and electrically connected to a surface conductor of the insertion hole by a reaction force caused by deformation.

The deformation part is provided at an end portion of the bar part and configured to be deformed in a deformation direction when inserted into the insertion hole. The deformation part has a shape expanding at a part between a front end portion of the deformation part and the end portion of the bar part.

The deformation part includes a recess, a front boundary portion and a rear boundary portion. The recess is provided between the front end portion of the deformation part and the end portion of the bar part. The recess is recessed in the deformation direction from a peripheral portion.

The front boundary portion defines a boundary between the recess and a surface of the deformation part adjacent to the front end portion of the deformation part. The front boundary portion has a right angle or an obtuse angle with respect to the surface of the deformation part. The rear boundary portion defines a boundary between the recess and the surface of the deformation part adjacent to the end portion of the bar part. The rear boundary portion has a curved surface shape.

According to the first aspect of the present disclosure, since the deformation part includes the front boundary portion having a right angle or an obtuse angle with respect to the deformation part, when the press-fit terminal is inserted into the insertion hole, a stress is applied to the surface conductor of the insertion hole to deform the surface conductor. Especially, since the deformation part includes the recess, the surface conductor is easily deformed by the stress applied from the front boundary portion. Therefore, according to the first aspect of the present disclosure, at least the front boundary portion of the deformation part breaks into the surface conductor to increase the holding force as compared with the structure without the front boundary portion.

Further, according to the first aspect of the present disclosure, since the rear boundary portion has the curved surface shape, the surface conductor is less likely to be scraped while inserting the press-fit terminal into the insertion hole. Therefore, reduction of the holding force due to scraping of the surface conductor can be suppressed. Further, since the scraping of the surface conductor is suppressed, an electrical connection state between the press-fit terminal and the surface conductor can be secured.

According to a second aspect of the present disclosure, an electronic device includes the press-fit terminal according to the first aspect of the present disclosure and a circuit board as the attachment body.

According to the second aspect of the present disclosure, the electronic device includes the press-fit terminal achieving the above described effects. Therefore, the press-fit terminal is less likely to be easily dropped out of the circuit board. Further, mechanical and electrical connection between the circuit board and the press-fit terminal can be improved.

What is claimed is:

1. A press-fit terminal for being press-fitted and deformed in an insertion hole of an attachment body and electrically connected to a surface conductor of the insertion hole by a reaction force caused by deformation, the press-fit terminal comprising:
   a bar part; and
   a deformation part provided at an end portion of the bar part and configured to be deformed in a deformation direction when inserted into the insertion hole, wherein
   the deformation part has a shape expanding at a part between a front end portion of the deformation part and the end portion of the bar part, and
   the deformation part includes:
   a plurality of recesses each provided between the front end portion of the deformation part and the end portion of the bar part, the plurality of recesses being recessed in the deformation direction from a peripheral portion;
   a front boundary portion defining a boundary between each of the plurality of recesses and a surface of the deformation part adjacent to the front end portion of the deformation part, the front boundary portion having a right angle or an obtuse angle with respect to the surface of the deformation part; and
   a rear boundary portion defining a boundary between each of the plurality of recesses and the surface of the deformation part adjacent to the end portion of the bar part, the rear boundary portion having a curved surface shape,.
   the deformation part includes a contact region where the deformation part is in contact with the surface conductor when inserted into the insertion hole,
   the contact region includes a maximum width portion of the deformation part having a maximum width in the deformation direction, and
   the front boundary portion is located between the maximum width portion and the end portion of the bar part,
   the deformation part has a first deformation portion and a second deformation portion, the first deformation portion is a half of the deformation part with respect to an insertion axis, the second deformation portion is another half of the deformation part with respect to the insertion axis
   the plurality of recesses are provided by only two recesses,
   the front boundary portion of one of the two recesses is included in the first deformation portion, and
   the front boundary portion of another one of the two recesses is included in the second deformation portion.

2. The press-fit terminal according to claim 1, wherein the front boundary portion extends in a direction different from an insertion direction in which the press-fit terminal is to be inserted in the insertion hole.

3. The press-fit terminal according to claim 1, wherein at least the surface of the deformation part contains tin alloy.

4. The press-fit terminal according to claim 1, wherein the front boundary portion includes a bent portion protruding toward the front end portion of the deformation part.

5. The press-fit terminal according to claim 1, wherein the deformation part includes a first deformation part and a second deformation part,
   the first deformation part includes a first front boundary portion corresponding to the front boundary portion,
   the second deformation part includes a second front boundary portion corresponding to the front boundary portion,
   the first front boundary portion and the second front boundary portion extend in directions different from an insertion direction in which the press-fit terminal is to be inserted in the insertion hole, and
   the first front boundary portion and the second front boundary portion incline with respect to the insertion direction in directions different from each other.

6. An electronic device comprising:
the press-fit terminal according to claim 1; and
a circuit board as the attachment body.

7. The electronic device according to claim 6, wherein
the circuit board has the insertion hole, and
the insertion hole includes the surface conductor mainly containing copper or tin.

* * * * *